(12) United States Patent
Bellini et al.

(10) Patent No.: US 12,062,698 B2
(45) Date of Patent: Aug. 13, 2024

(54) SILICON CARBIDE TRANSISTOR DEVICE

(71) Applicant: Hitachi Energy Ltd, Zürich (CH)

(72) Inventors: Marco Bellini, Schlieren (CH); Lars Knoll, Hägglingen (CH); Stephan Wirths, Thalwil (CH)

(73) Assignee: Hitachi Energy Ltd, Zürich (CH)

( * ) Notice: Subject to any disclaimer, the term of this patent is extended or adjusted under 35 U.S.C. 154(b) by 397 days.

(21) Appl. No.: 17/631,730

(22) PCT Filed: Jul. 31, 2020

(86) PCT No.: PCT/EP2020/071689
§ 371 (c)(1),
(2) Date: Jan. 31, 2022

(87) PCT Pub. No.: WO2021/019082
PCT Pub. Date: Feb. 4, 2021

(65) Prior Publication Data
US 2022/0278205 A1    Sep. 1, 2022

(30) Foreign Application Priority Data
Aug. 1, 2019   (EP) ...................................... 19189583

(51) Int. Cl.
*H01L 23/00* (2006.01)
*H01L 21/04* (2006.01)
(Continued)

(52) U.S. Cl.
CPC ...... *H01L 29/1608* (2013.01); *H01L 21/0485* (2013.01); *H01L 29/41775* (2013.01);
(Continued)

(58) Field of Classification Search
CPC ............. H01L 29/1608; H01L 21/0485; H01L 29/41775
See application file for complete search history.

(56) References Cited

U.S. PATENT DOCUMENTS 5,455,432 A   10/1995  Hartsell et al.
5,502,003 A    3/1996  Ogino et al.
(Continued)

FOREIGN PATENT DOCUMENTS

CN    101681842 A    3/2010
DE   102006029281 A1  2/2007
(Continued)

OTHER PUBLICATIONS

Chaddha, A. K., et al., "Thermally stable, low specific resistance (1.30×10 -5 cm2) TiC Ohmic contacts to n-type 6Ha-SiC", Applied Physics Letters, vol. 66, No. 6, Woodbury, NY, Feb. 6, 1995, pp. 760-762.
(Continued)

*Primary Examiner* — Anthony Ho
(74) *Attorney, Agent, or Firm* — Slater Matsil, LLP

(57) ABSTRACT

A silicon carbide transistor device includes a silicon carbide semiconductor and a silicon carbide epitaxial layer formed at a top surface of the substrate. A source structure is formed in a top surface of the silicon carbide epitaxial layer and includes a p-well region, a n-type source region and a p-type contact region. A source contact structure is formed over and electrically connected to a top surface of the source structure. A planar gate structure includes a gate dielectric and a gate runner adjacent a p-type channel region. The gate dielectric covers the channel region, at least part of the source structure and at least part of the source contact structure. The gate runner is electrically insulated from the channel region and the source structure and the source contact structure by the gate dielectric and overlaps the channel region.

20 Claims, 3 Drawing Sheets

(51) Int. Cl.
*H01L 29/16* (2006.01)
*H01L 29/417* (2006.01)
*H01L 29/423* (2006.01)
*H01L 29/66* (2006.01)
*H01L 29/739* (2006.01)
*H01L 29/78* (2006.01)

(52) U.S. Cl.
CPC .. *H01L 29/42376* (2013.01); *H01L 29/66068* (2013.01); *H01L 29/7397* (2013.01); *H01L 29/7813* (2013.01)

(56) References Cited

U.S. PATENT DOCUMENTS

| | | |
|---|---|---|
| 9,224,858 B1 | 12/2015 | Camillo-Castillo et al. |
| 2010/0258815 A1 | 10/2010 | Tarui |
| 2013/0043490 A1 | 2/2013 | Sorada |
| 2013/0049090 A1 | 2/2013 | Lindsay et al. |
| 2013/0328062 A1 | 12/2013 | Hisamoto et al. |
| 2013/0341647 A1 | 12/2013 | Yamada et al. |
| 2014/0061675 A1 | 3/2014 | Watanabe et al. |
| 2015/0024581 A1 | 1/2015 | Imai |
| 2015/0287825 A1 | 10/2015 | Mayuzumi et al. |
| 2016/0056040 A1 | 2/2016 | Tanaka et al. |
| 2017/0108545 A1 | 4/2017 | Sometani et al. |
| 2017/0207301 A1 | 7/2017 | Harada et al. |
| 2019/0006471 A1 | 1/2019 | Watanabe et al. |
| 2021/0119008 A1 | 4/2021 | Takahashi et al. |
| 2022/0359753 A1 | 11/2022 | Bohr |

FOREIGN PATENT DOCUMENTS

| | | |
|---|---|---|
| EP | 2922094 A2 | 9/2015 |
| EP | 2922094 A3 | 12/2015 |
| EP | 3255676 A1 | 12/2017 |
| JP | H0730111 A | 1/1995 |
| JP | 2002016017 A | 1/2002 |
| JP | 2013254842 A | 12/2013 |
| JP | 2014003253 A | 1/2014 |
| JP | 2014216529 A | 11/2014 |
| KR | 20070019634 A | 2/2007 |
| WO | 2012172988 A1 | 12/2012 |
| WO | 2016113004 A1 | 7/2016 |
| WO | 2016170978 A1 | 10/2016 |
| WO | 2019198168 A1 | 10/2019 |

OTHER PUBLICATIONS

Brown, Jess, et al., "Improving the performance of power MOSFETs by tailoring the driver to the specific MOSFET gate requirements", PCIM Europe 2003 International Conference and Exhibition, Nuremberg, Germany, May 20-22, 2003, 6 pages.

SILICON CARBIDE TRANSISTOR DEVICE

CROSS-REFERENCE TO RELATED APPLICATIONS

This application is a national stage application of International Application No. PCT/EP2020/071689, filed on Jul. 31, 2020, which claims priority to European Patent Application No. 19189583.8, filed on Aug. 1, 2019, which applications are hereby incorporated herein by reference.

TECHNICAL FIELD

The present invention refers to a silicon carbide (SiC) transistor device and a method for manufacturing a silicon carbide (SiC) transistor device.

BACKGROUND

Power transistor devices are widely used to switch high currents and to withstand high voltages. Metal oxide semiconductor field effect transistors (MOSFETs) and insulated gate bipolar transistors (IGBTs) are the most important power electronic devices for large scale or very large-scale integrated circuits. Low on-resistance and large load currents make it perfect for use as a switching device. In a power transistor, a control signal is supplied to a gate electrode, which is electrically insulated from a semiconductor substrate, and current is conducted by transmitting charge carriers. Power transistors employ semiconductor processing techniques that are similar to those of today's VLSI circuits, although the device geometry, voltage and the current levels are significantly different from the design used in VLSI devices.

Most transistors, in particular for storing data in memory technology, are still made of silicon (Si). However, with the development of the electronic technology, high temperature, high frequency, etc. enhanced the requirements for semiconductor devices and circuits. Si cannot meet these requirements—in particular for power switches—due to its material properties, and therefore SiC materials have been developed for semiconductor devices operating at high power, high temperature and high frequency. For power switching applications, insulated gate bipolar transistor (IGBTs) and metal oxide semiconductor field effect transistors (MOSFETs) are widely used. These elements have a structure in which the gate electrode portion is electrically insulated from the element body. Since it is only necessary to charge and discharge the capacitor constituted by the gate electrode and the element body, the gate control current is significantly smaller than that of, e.g., a gate turn-off transistor.

US Patent Publication 2013/043490 A1 shows a semiconductor device including: a semiconductor layer arranged on the principal surface of a substrate and made of a wide bandgap semiconductor; a trench which is arranged in the semiconductor layer and which has a bottom and a side surface; an insulating region arranged on the bottom and side surface of the trench; and a conductive layer arranged in the trench and insulated from the semiconductor layer by the insulating region. The insulating region includes a gate insulating film arranged on the bottom and the side surface of the trench and a gap arranged between the gate insulating film and the conductive layer at the bottom of the trench. The gate insulating film contacts with the conductive layer on a portion of the side surface of the trench but does not contact with the conductive layer at the bottom of the trench. The thickness of the insulating region measured from the bottom of the trench through the lower surface of the conductive layer is greater around the center of the trench than beside its side surface.

European patent publication EP 2 922 094 A2 discloses a semiconductor device that includes a n-type SiC layer; a SiC region provided on the n-type SiC layer and containing H (hydrogen) or D (deuterium) in an amount of $1 \times 10^{18}$ cm$^{-3}$ or more and $1 \times 10^{22}$ cm$^{-3}$ or less and a metal layer provided on the SiC region. Furthermore, a method for producing same is disclosed in EP 2 922 094 A2.

U.S. Pat. No. 5,455,432 A1 discloses a diamond semiconductor device with a carbide interlayer including a diamond layer having a semiconducting diamond region of first conductivity type therein and an insulated gate structure on a face of the diamond layer. The relatively thin carbide interfacial layer is provided between the insulated gate structure and the diamond layer in order to inhibit the formation of electrically active defects, such as interface states at the face. By inhibiting the formation of interface states at the face, the carbide interfacial layer suppresses parasitic leakage of charge carriers from the diamond layer to the insulated gate structure. The carbide interfacial layer may be intrinsic silicon carbide or an intrinsic refractory metal carbide (e.g., TiC or WC) or the layer may be of opposite conductivity type to thereby form a P-N heterojunction with the diamond layer. The carbide interfacial layer and the insulated gate structure may be used in a variety of diamond electronic devices such as MIS capacitors, enhancement-mode and buried-channel insulated-gate field effect transistors (IGFETs), surface-channel and buried-channel charge-coupled devices (CCDs), detectors, heterojunction devices, and other related field effect devices. Related fabrication methods are also disclosed.

U.S. Pat. No. 9,224,858 A1 discloses a field effect transistor (FET) (e.g., a lateral double-diffused metal oxide semiconductor field effect transistor (LDMOSFET)) and a method of forming the FET. In the FET, an etch stop pad is on a semiconductor substrate (e.g., a P-type silicon substrate). A semiconductor layer (e.g., a silicon layer) is also on the substrate and extends laterally over the etch stop pad. A first well region (e.g., an N-well region) extends through the semiconductor layer into the substrate such that it contains the etch stop pad. A second well region (e.g., a P-well region) is in the first well region aligned above the etch stop pad. A source region (e.g., an N-type source region) is in the second well region. A buried insulation region (e.g., a buried air-gap insulation region) is within the first well region aligned below the etch stop pad so as to limit vertical capacitor formation.

WO 1997/33308 discloses Metallic osmium (Os) on SiC forming a contact that remains firmly attached to the SiC surface and forming an effective barrier against diffusion from the conductive metal. On n-type SiC, Os forms an abrupt Schottky rectifying junction having essentially unchanged operating characteristics to at least 1050° C. and Schottky diodes that remain operable to 1175° C. and a barrier height over 1.5 eV. On p-type SiC, Os forms an ohmic contact with specific contact resistance of 10-4 ohmcm2. Ohmic and rectifying contacts to a TiC layer on a SiC substrate are formed by depositing a WC layer over the TiC layer, followed by a metallic W layer. Such contacts are stable to at least 1150° C. Electrodes connect to the contacts either directly or via a protective bonding layer such as Pt or PtAu alloy.

To obtain an element structure capable of both-face pressure welding by using silicon carbide as the basic material of the element and by separating spatially a plane position where a source region and gate region are resident and using titanium carbide having excellent crystalline matching with electrical contact with a source electrode and a second semiconductor layer, JPH0730111 A discloses on a substrate comprising a drain electrode layer and titanium carbide, first, second, and third semiconductor layers comprising an epitaxial layer of p and n type doped silicon carbide and a source electrode layer stacked one on top of the other. A gate insulating film is formed on a recessed part extending from the third semiconductor layer to the first semiconductor layer, and a gate electrode is formed on top. Since the gate electrode is provided at the recessed part, the plane positions of the source electrode and the gate electrode are spatially separated. A contact between the source electrode 17 and the second semiconductor layer is formed by a titanium carbide layer having excellent crystalline matching with silicon carbide to enable both-surface pressure welding, thus materializing large current properties with excellent heat release characteristics of silicon carbide.

An ideal power transistor, would have very short transition times, near zero switching on resistance RDS(on), and infinite power handling capability. These characteristics depend largely on the device physics and technology. When the high side of a power switch turns on, a high dV/dt transition on the switching node might be caused. Such a sharp rise in voltage may inflict a voltage pulse on the low side MOSFET gate due to the Miller capacitance (=gate-to-drain capacitance) feedback. If the gate threshold voltage is low, then the occurrence of this condition may be more frequent than for a MOSFET with high gate threshold value. The switching performance of a switching device is determined by the time required to establish voltage changes across capacitances. RG is the distributed resistance of the gate and is approximately inversely proportional to the active area. LS and LD are source and drain lead inductances and are around a few tense of nH. Typical values of input (CiSS), output (CoSS) and reverse transfer (CrSS) capacitances given in the data sheets are used by circuit designers as a starting point in determining circuit component values.

SUMMARY

Embodiments of the present invention can improve the shoot-through withstand capability to protect MOS-based SiC planar and trench devices as shown, e.g., in FIG. 1A showing a prior art trench device and FIG. 1B showing a prior art planar device. Both prior art devices in FIGS. 1A and 1B are vertical switches, switching a current flowing vertically from a n-type source 4 to a n-type drain 11 controlled by a gate 6. On a SiC substrate 1 a n-type epitaxial drift layer 2 is provided. Both devices in FIGS. 1A and 1B comprise a p-well region 3, 15 a n-type source region 4, a p-type contact region 5, a gate dielectric 7 and a gate 6. While in the device shown in FIG. 1A, the gate 6 and the gate dielectric 7 is formed within a trench extending through the p-well 3, the gate structure 6, 7 in FIG. 1B is planar on top of the device. The planar device according to FIG. 1B furthermore shows in detail the channel region 8.

A silicon carbide (SiC) transistor device according to one embodiment of the invention comprises a SiC semiconductor substrate having a top surface, a SiC epitaxial layer formed on the top surface of the SiC semiconductor substrate, the SiC epitaxial layer having a top surface, a source structure formed in the top surface of the SiC epitaxial layer, the source structure having a top surface and comprising a p-well region, a n-type source region and a p-type contact region, a source contact structure formed over and electrically connected to the top surface of the source structure, wherein the contact structure comprises one of Titanium carbide (TiC), Tungsten carbide (WC) and Nickel carbide ($NiC_3$), a gate structure including a gate dielectric and a gate runner, and a p-type channel region, wherein the gate dielectric covers the channel region, at least part of the source structure and at least part of the source contact structure and wherein the gate runner is electrically insulated from the channel region, the source structure and the source contact structure by the gate dielectric and overlaps the channel region and at least part of the source contact structure, wherein the gate structure is a planar structure.

In another embodiment, the source contact structure has a thickness in a range of 2 nm to 200 nm.

In another embodiment, the SiC semiconductor substrate is a 4H—SiC substrate.

In another embodiment, the Silicon carbide (SiC) transistor is an Insulated Gate Bipolar 5 Transistor (IGBT).

In another embodiment, the Silicon carbide (SiC) transistor is a Metal-Oxide-Semiconductor Field-Effect Transistor, (MOSFET).

Another embodiment of the present invention is directed to a method for manufacturing a Silicon carbide (SiC) transistor device comprising the steps of epitaxially forming a SiC epitaxial layer on a top surface of a SiC semiconductor substrate, the SiC epitaxial layer having a top surface, forming a source structure in the top surface of the SiC epitaxial layer, the source structure having a top surface and comprising a p-well region, a n-type source region and a p-type contact region, forming a source contact structure over and electrically connected to the top surface of the source structure, wherein the contact structure comprises one of Titanium carbide (TiC), Tungsten carbide (WC) and Nickel carbide ($NiC_3$), after the forming of the source contact structure forming a gate structure including a gate dielectric and a gate runner so that the gate dielectric covers at least part of the source structure and at least part of the source contact structure and so that the gate runner, which is electrically insulated from the source structure and the source contact structure by the gate dielectric, overlap at least part of the source contact structure wherein the device comprises a p-type channel and wherein the gate structure is a planar structure.

In another embodiment of the method for manufacturing a silicon carbide (SiC) transistor device, the source contact structure is formed at a temperature in a range of 600° C. to 1300° C.

The foregoing and other features and advantages of the invention will become more readily apparent from the following detailed description of an exemplary embodiment of the invention which proceeds with reference to the accompanying drawings.

DETAILED DESCRIPTION OF ILLUSTRATIVE EMBODIMENTS

Figure 1A:
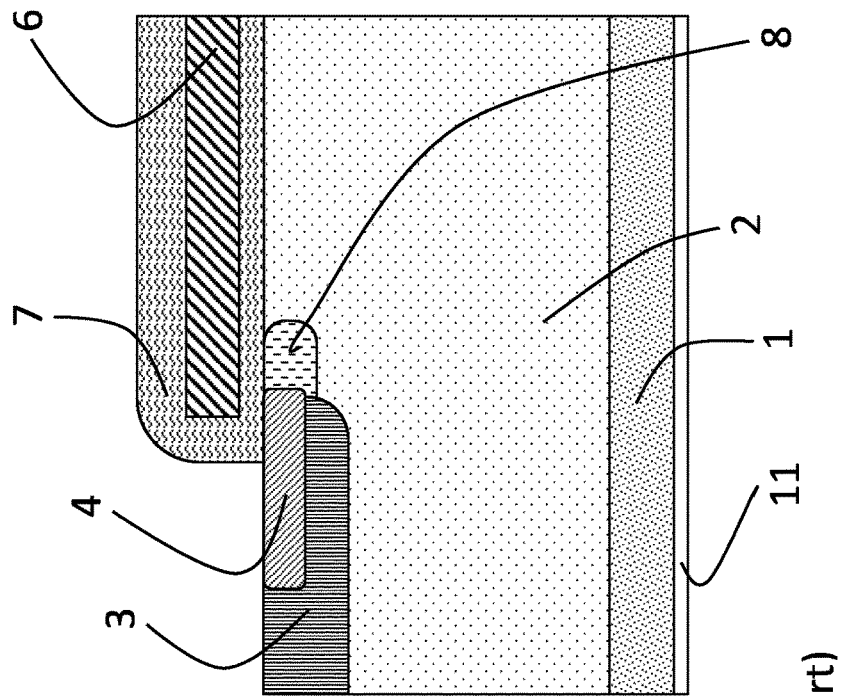
FIGS. 1A and 1B show prior art MOS based vertical SiC trench (FIG. 1A) and planar (FIG. 1B) devices.
Figure 1B:
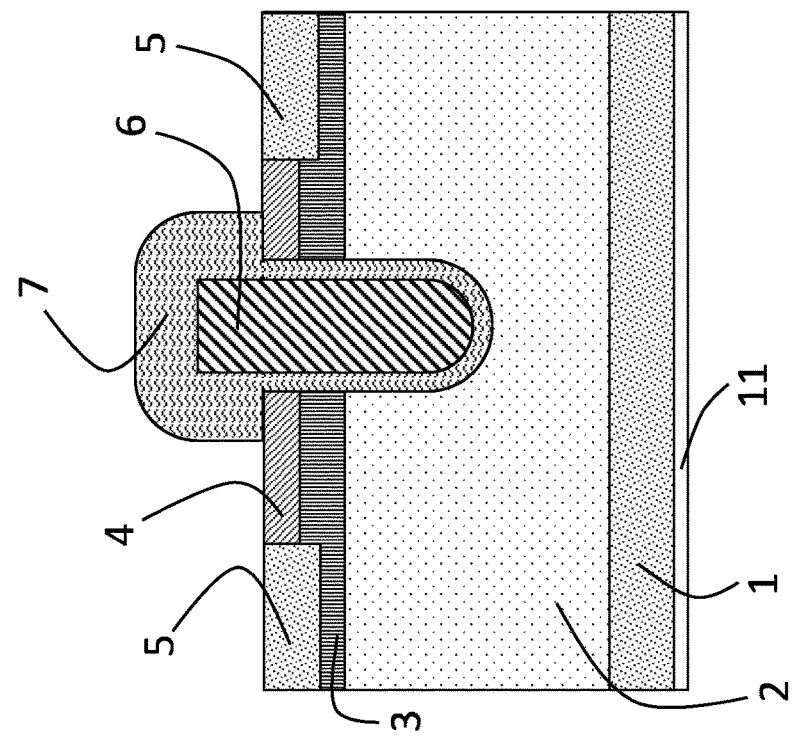

By controlling the ratio of the capacitances involved in the above mentioned feedback mechanism (Cgd and Cgs) in a combination of low-side and high-side MOSFETs, the VGS pulse may be limited by the equation $$V_{GS}(t_0) = R_G * C_{rss} * \frac{V_{DS}}{t_0}\left(1 - e^{\frac{-t_0}{R_G * C_{iss}}}\right)$$

For improving the shoot-through capability of a switching transistor, a low CrSS/CiSS capacitance ratio (typically less than 0.4) is desired. To decrease the CrSS/CiSS capacitance ratio either the reverse transfer capacity (CrSS) may be decreased and/or the input capacity (CiSS) may be increased.

To increase CiSS it is proposed to replace the commonly used Ni-silicide contacts by titanium carbide (TiC) source contacts. One advantage, compared e.g. to Nickel silicides, is that TiC is more stable and may withstand higher temperatures. Nickel silicides cannot withstand the temperatures of gate oxidation and poly deposition and cannot realize the described integration sequence. To furthermore prevent shoot-through even in low threshold voltage devices, it is furthermore proposed to adjust CiSS by overlapping the gate electrode and the TiC source contacts. By overlapping the gate electrode and the TiC source contacts, CiSS may be increased, and shoot-through may be mitigated. As shown, e.g., in FIG. 2C, a silicon carbide (SiC) transistor device according to one embodiment of the invention comprises a SiC semiconductor substrate 1 having a top surface and a bottom surface, a drain region 11 on the bottom surface of the SiC semiconductor substrate 1, a SiC epitaxial layer 2 formed on the top surface of the SiC semiconductor substrate 1, the SiC epitaxial layer 2 having a top surface, a source structure 3, 4, 5 formed in the top surface of the SiC epitaxial layer 2, the source structure 3, 4, 5 having a top surface, a source contact structure 9 formed over and electrically connected to the top surface of the source structure 3, 4, 5, wherein the source contact structure 9 comprises one of Titanium carbide (TiC), Tungsten carbide (WC) and Nickel carbide (NiC$_3$), a gate structure 6, 7 including a gate dielectric 7 and a gate runner 6, and a p-type channel region 10, wherein the gate dielectric 7 covers the channel region 10, at least part of the source structure 5 3, 4, 5 and at least part of the source contact structure 9 and wherein the gate runner 6 is electrically insulated from channel region 10, the source structure 3, 4, 5 and the source contact structure 9 by the gate dielectric 7 and overlaps the channel region 10 and at least part of the source contact structure 9. The source structure 3, 4, 5 comprises a p-well region 3, an n-type source region 4 and a p-type contact region 5.

The SiC semiconductor substrate 1 may be e.g. a 3C—SiC, a 4H—SiC substrate or a 6H—SiC substrate, for example. In case of a 3C—SiC epitaxial layer, the SiC semiconductor substrate 1 may be replaced by a Silicon (Si) substrate, for example.

The source contact structure 9 may have a thickness in a range of 2 nm to 200 nm, for example. In an exemplary embodiment, the thickness is 70 nm.

The silicon carbide (SiC) transistor may be an Insulated Gate Bipolar Transistor (IGBT) or a Metal-Oxide-Semiconductor Field-Effect Transistor (MOSFET), a SiC junction Field-Effect transistor (SiC-JFET) or a SiC bipolar junction transistors (SiC-BJT), for example.

Because TiC forms an electrical ohmic contact junction with n-type SiC and TiC is very stable in terms of surface roughness and electrical properties at temperatures higher than 1000° C., the titanium carbide (TiC) source contacts may be manufactured before the oxide deposition/oxidation process. Such an oxide deposition/oxidation process is necessary, e. g., for the gate dielectric formation, gate insulation or passivation, as well as for polysilicon layer deposition (e.g., for the gate runner) and high temperature unveiling/activation steps. For a conventional Ni-silicide source contact, the oxide deposition/oxidation processes have to be performed before the source contact deposition, because of the temperature sensitivity of the Ni silicide contacts. The use of TiC source contacts therefore allows to integrate completely new process steps that require high thermal budgets. A typical integration sequence for manufacturing a planar vertical power MOSFET is shown in FIGS. 2A-2C.

Figure 2A:
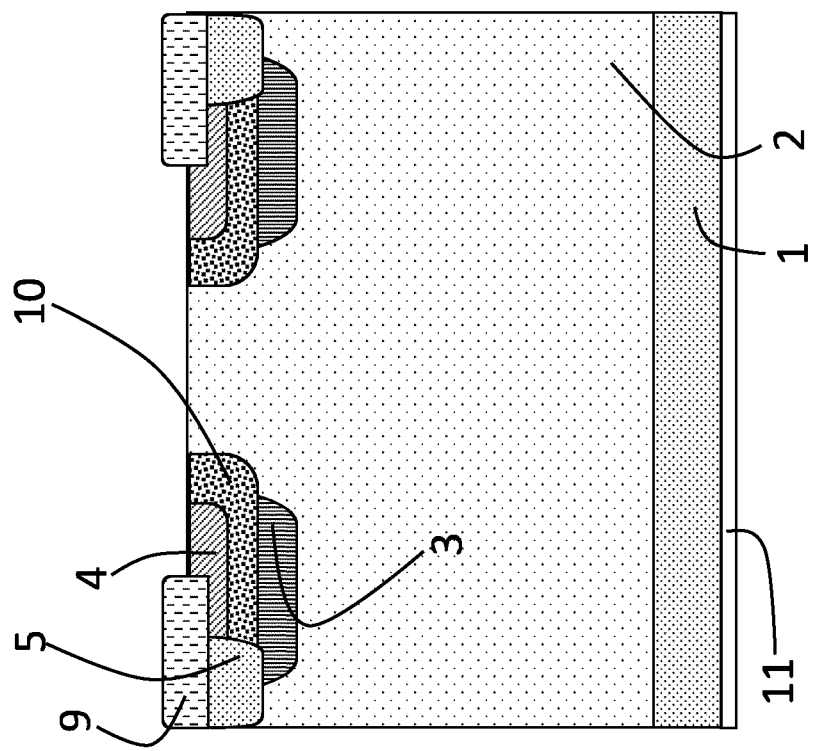
FIGS. 2A, 2B, 2C show an integration sequence in a process for manufacturing a vertical silicon carbide (SiC) planar transistor device according to an embodiment.
Figure 2B:
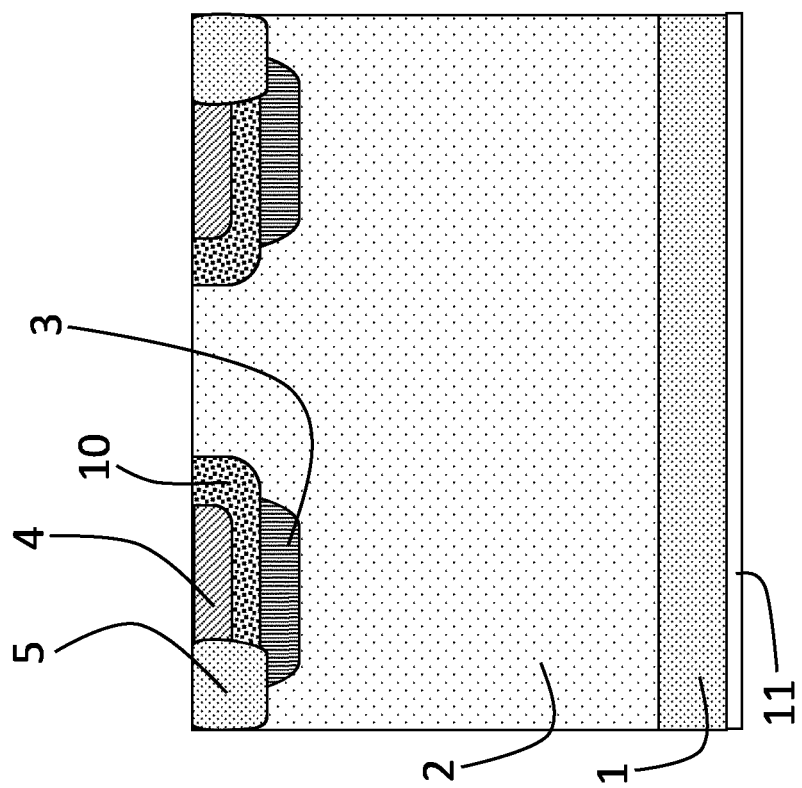

Starting from the planar MOS-based device in FIG. 2A, where on a SiC substrate 1 an n-type epitaxial drift layer 2 is provided. The device in FIGS. 2A to 2C furthermore comprises a p-well region 3, an n-type source region 4, a p-type contact region 5, and a p-type channel region 10. As already mentioned above, contrary to a prior art manufacturing process, according to an embodiment of the manufacturing process of the present invention, the TiC contact structure 9 for contacting the source region 4 is formed—in the order of the process steps—before the forming of the gate structure, consisting of the gate insulation 7, which may be a gate dielectric, and the gate 6. It is emphasized that according to an embodiment of the manufacturing process of the present invention the gate structure 6, 7 is formed after the TiC source contact structure 9. This integration scheme (changing of the order of the manufacturing process steps) is possible, because of the capability of TiC to withstand high temperatures.

Figure 2D:
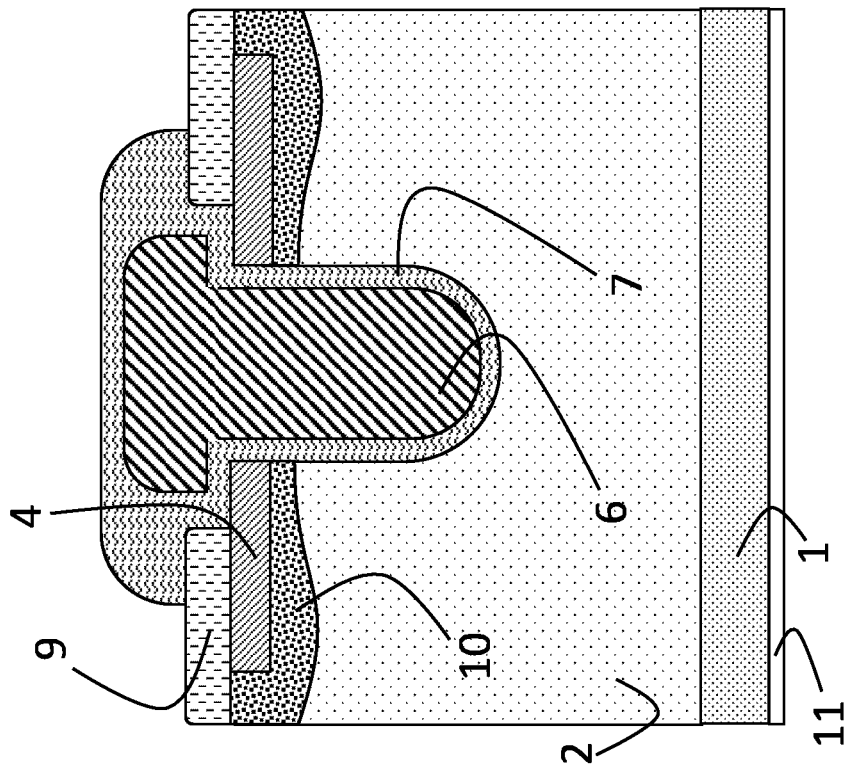
FIG. 2D shows a vertical power MOSFET having a trench gate structure as a comparative example which does not form part of claimed invention but serves for a better understanding thereof.
Figure 2C:
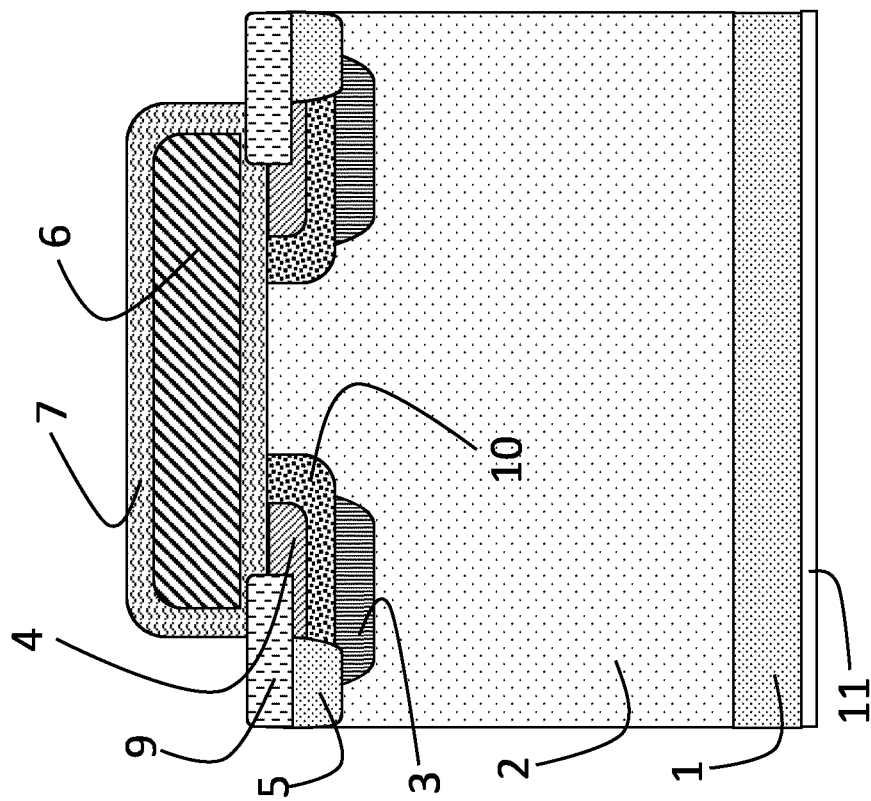

As a comparative example a vertical power MOSFET having a trench gate structure is shown in FIG. 2D. In this comparative example, the gate structure is formed not planar on the top surface of the SiC semiconductor substrate 1, but vertically in a trench within the p-well region 3 and between the n-type source regions 4. The gate electrode 6 is formed in this comparative example within the trench and insulated by the gate dielectric 7.

Another embodiment of the present invention is directed to a method for manufacturing a silicon carbide (SiC) transistor device comprising the steps of epitaxially forming a SiC epitaxial layer 2 on a top surface of a SiC semiconductor substrate 1, the SiC epitaxial layer 2 having a top surface, forming a source structure 3, 4, 5 in the top surface of the SiC epitaxial layer 2, the source structure 3, 4, 5 having a top surface, forming a source contact structure 9 over and electrically connected to the top surface of the source structure 3, 4, 5, wherein the contact structure 9 comprises one of Titanium carbide (TiC), Tungsten carbide (WC), and Nickel carbide (NiC$_3$), after the forming of the source contact structure 9 forming a gate structure 6, 7 including a gate dielectric 7 and a gate runner 6 so that the gate dielectric 7 covers at least part of the source structure 3, 4, 5 and at least part of the source contact structure 9 and the gate runner 6, which is electrically insulated from the source structure 3, 4, 5 and the source contact structure 9 by the gate dielectric 7, overlaps at least part of the source contact structure 9.

In another embodiment of the method for manufacturing a silicon carbide (SiC) transistor device, the source contact structure 9 is formed at a temperature in a range of 600° C. to 1300° C.

In another embodiment, the TiC contact layer may be formed with a thickness of 70 nm by a Chemical Vapor Deposition (CVD) process in a range of 1200° C. to 1300°

C. in diluent hydrogen using titanium tetrachloride as Ti source and ethylene as carbon source, for example.

This temperature anneals the TiC as it is formed. In an embodiment, TiC thickness may be less than about 180 nm to avoid strain in the SiC layer, for example.

The invention claimed is:

1. A silicon carbide transistor device comprising:
   a silicon carbide semiconductor substrate having a top surface;
   a silicon carbide epitaxial layer formed at the top surface of the silicon carbide semiconductor substrate;
   a source structure formed in a top surface of the silicon carbide epitaxial layer, the source structure comprising a p-well region, a n-type source region and a p-type contact region;
   a source contact structure formed over and electrically connected to a top surface of the source structure, the source contact structure comprising titanium carbide, tungsten carbide, or nickel carbide; and
   a planar gate structure including a gate dielectric and a gate runner adjacent a p-type channel region, wherein the gate dielectric covers the channel region, at least part of the source structure and at least part of the source contact structure, and wherein the gate runner is electrically insulated from the channel region, the source structure and the source contact structure by the gate dielectric, the gate runner overlapping the channel region and at least part of the source contact structure.

2. The silicon carbide transistor device according to claim 1, wherein the source contact structure has a thickness in a range of 2 nm to 200 nm.

3. The silicon carbide transistor device according to claim 1, wherein the silicon carbide semiconductor substrate is a 4H-SiC substrate.

4. The silicon carbide transistor device according to claim 1, wherein the silicon carbide semiconductor substrate is a 3H-SiC substrate.

5. The silicon carbide transistor device according to claim 1, wherein the silicon carbide semiconductor substrate is a 6H-SiC substrate.

6. The silicon carbide transistor device according to claim 1, wherein the source contact structure comprises titanium carbide.

7. The silicon carbide transistor device according to claim 1, wherein the source contact structure comprises tungsten carbide.

8. The silicon carbide transistor device according to claim 1, wherein the source contact structure comprises nickel carbide.

9. The silicon carbide transistor device according to claim 1, further comprising a drain structure formed at a bottom surface of the silicon carbide semiconductor substrate, the bottom surface opposite the top surface.

10. The silicon carbide transistor device according to claim 1, wherein the silicon carbide transistor device is an insulated gate bipolar transistor.

11. The silicon carbide transistor device according to claim 1, wherein the silicon carbide transistor device is a metal-oxide-semiconductor field-effect transistor.

12. A method for manufacturing a silicon carbide transistor device, the method comprising:
    epitaxially forming a silicon carbide epitaxial layer over a top surface of a silicon carbide semiconductor substrate;
    forming a source structure in a top surface of the silicon carbide epitaxial layer, the source structure comprising a p-well region, a n-type source region and a p-type contact region;
    forming a source contact structure over and electrically connected to the top surface of the source structure, wherein the source contact structure comprises titanium carbide, tungsten carbide, or nickel carbide; and
    after the forming of the source contact structure, forming a planar gate structure that includes gate dielectric and a gate runner so that the gate dielectric covers at least part of the source structure and at least part of the source contact structure, and so that the gate runner is electrically insulated from the source structure and the source contact structure by the gate dielectric and overlaps at least part of the source contact structure.

13. The method according to claim 12, wherein the source contact structure is formed at a temperature in a range of 600° C. to 1300° C.

14. The method of claim 12, wherein forming the source contact structure comprises forming a titanium carbide structure by a chemical vapor deposition process in a range of 1200° C. to 1300° C. in diluent hydrogen using titanium tetrachloride as a titanium source and ethylene as a carbon source.

15. The method according to claim 14, wherein the source contact structure has a thickness less than about 180 nm.

16. The method according to claim 12, wherein the source contact structure has a thickness in a range of 2 nm to 200 nm.

17. The method according to claim 12, wherein the silicon carbide semiconductor substrate is a 4H-SiC substrate.

18. The method according to claim 12, further comprising forming a drain structure over a bottom surface of the silicon carbide semiconductor substrate, the bottom surface opposite the top surface.

19. A silicon carbide transistor device comprising:
    a silicon carbide semiconductor substrate having a top surface, wherein the silicon carbide semiconductor substrate is a 4H-SiC substrate;
    a silicon carbide epitaxial layer formed at the top surface of the silicon carbide semiconductor substrate;
    a source structure formed in a top surface of the silicon carbide epitaxial layer, the source structure comprising a p-well region, an n-type source region and a p-type contact region;
    a source contact structure formed over and electrically connected to a top surface of the source structure, the source contact structure comprising titanium carbide and having a thickness in a range of 2 nm to 200 nm;
    a drain structure formed at a bottom surface of the silicon carbide semiconductor substrate, the bottom surface opposite the top surface; and
    a planar gate structure including a gate dielectric and a gate runner adjacent a p-type channel region, wherein the gate dielectric covers the channel region, at least part of the source structure and at least part of the source contact structure, and wherein the gate runner is electrically insulated from the channel region, the source structure and the source contact structure by the gate dielectric, the gate running overlapping the channel region and at least part of the source contact structure.

20. The silicon carbide transistor device according to claim 19, wherein the source contact structure has a thickness less than about 180 nm.

* * * * *